(12) United States Patent  
Chen et al.

(10) Patent No.: US 8,674,378 B1  
(45) Date of Patent: Mar. 18, 2014

(54) LIGHT EMITTING DIODE

(71) Applicant: Lextar Electronics Corporation, Hsinchu (TW)

(72) Inventors: Fu-Shin Chen, Xinfeng Township (TW); Jia-Ming Sung, Zhubei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/759,499

(22) Filed: Feb. 5, 2013

(30) Foreign Application Priority Data

Sep. 14, 2012 (TW) .............................. 101133755 A

(51) Int. Cl.
*H01L 21/33* (2006.01)

(52) U.S. Cl.
USPC .......... 257/88; 257/91; 257/98; 257/E33.072; 257/E33.073

(58) Field of Classification Search
USPC ............................ 257/88–98, E33.006, 72–73
See application file for complete search history.

(56) References Cited

U.S. PATENT DOCUMENTS

| | | | |
|---|---|---|---|
| 2011/0303940 A1* | 12/2011 | Lee et al. ........................ | 257/98 |
| 2012/0061709 A1* | 3/2012 | Pachler ........................... | 257/98 |
| 2012/0235190 A1* | 9/2012 | Keller et al. .................... | 257/98 |
| 2013/0113016 A1* | 5/2013 | West ............................... | 257/99 |
| 2013/0194779 A1* | 8/2013 | Narendran et al. ............. | 362/84 |
| 2013/0250544 A1* | 9/2013 | Zink et al. ...................... | 362/84 |

FOREIGN PATENT DOCUMENTS

TW             I340482           4/2011

* cited by examiner

*Primary Examiner* — Michael Lebentritt
(74) *Attorney, Agent, or Firm* — Moser Taboada

(57) ABSTRACT

A Light emitting diode (LED) includes a substrate, a LED chip, a wavelength conversion layer, a lens and a reflective layer. The LED chip is mounted on the substrate. The wavelength conversion layer covers the top surface of the LED chip and exposes the lateral surface of the LED chip. The lens is disposed on the substrate and encloses the LED chip and the wavelength conversion layer. The reflective layer is disposed on the lens for reflecting the light emitted from the lateral surface of the LED chip.

16 Claims, 4 Drawing Sheets

LIGHT EMITTING DIODE

RELATED APPLICATIONS

This application claims priority to Taiwan Application Serial Number 101133755, filed Sep. 14, 2012, which is herein incorporated by reference.

BACKGROUND

1. Technical Field

Embodiments of the present invention relate to an illumination apparatus. More particularly, embodiments of the present invention relate to a light emitting diode (LED).

2. Description of Related Art

In recent years, a light emitting diode (LED), which is eco-friendly, has been quickly replacing the conventional incandescent light bulbs and fluorescent lamps. Because the heat generated from the LED significantly reduces the lifetime and the illumination efficiency thereof, a chip-on-board (COB) LED is developed to lower the temperature during illumination. In the COB LED, a LED chip is directly mounted on a heat dissipation substrate for shortening the heat dissipation path, thereby lowering the temperature of the LED.

In a typical COB LED, the surface of the LED chip is covered by a wavelength conversion material for converting the wavelength of the light emitted by the LED chip.

However, under the limitation of the coating technique of the wavelength conversion material, most of the wavelength conversion material is coated on the top surface of the LED chip and only a few amount of the wavelength conversion material is coated on the lateral surface of the LED chip, such that the light emitted from the lateral surface of the LED cannot be converted, and differs from the light emitted by the top surface of the LED in wavelength. Therefore, a ring of the halation with different colors surrounding the LED chip is seen from the upper surface of the LED chip.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment of the present invention, a light emitting diode (LED) without the halation is provided, and it includes a substrate, an LED chip, a wavelength conversion layer, a lens and a reflective payer. The LED chip is mounted on the substrate. The wavelength conversion layer covers a top surface of the LED chip and exposes a lateral surface of the LED chip. The lens is disposed on the substrate and encloses the LED chip and the wavelength conversion layer. The reflective layer is disposed on the lens for reflecting a light emitted from the lateral surface of the LED chip.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
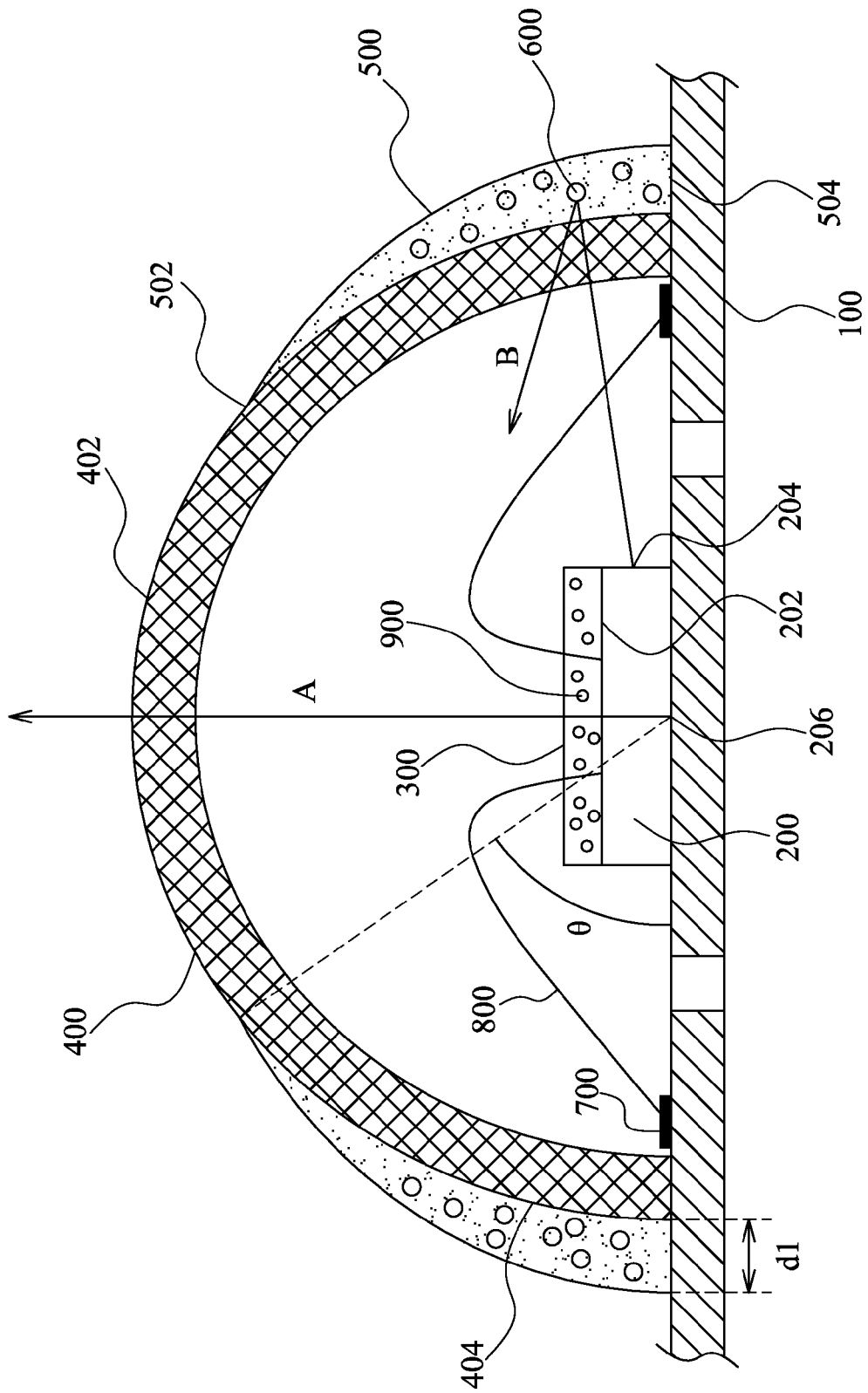
FIG. 1 is a cross-sectional view of a LED in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a LED in accordance with one embodiment of the present invention. As shown in FIG. 1, the LED includes a substrate 100, an LED chip 200, a wavelength conversion layer 300, a lens 400 and a reflective payer 500. The LED chip 200 is mounted on the substrate 100. The wavelength conversion layer 300 covers a top surface 202 of the LED chip 200 and exposes a lateral surface 204 of the LED chip 200. The lens 400 is disposed on the substrate 100 and encloses the LED chip 200 and the wavelength conversion layer 300. The reflective layer 500 is disposed on the lens 400 for reflecting a light emitted from the lateral surface 204 of the LED chip 200.

In this embodiment, the lateral surface 204 of the LED chip 200 is exposed and not covered by the wavelength conversion layer 300, so the wavelength of the light emitted by the lateral surface 204 is not converted. However, because the reflective layer 500 reflects the light emitted by the lateral surface 204, even though the light is not converted by the wavelength conversion layer 300 and consequently is still in a range of the short wavelength, such as blue light, it is reflected to the space between the lens 400 and the LED chip 200, and not propagates out of the lens 400 and forms the halation, such as a blue halation. Therefore, the LED in this embodiment can omit the halation.

In some embodiment, the lens 400 includes a top part 402. The top part 402 is located above the LED chip 200, and covers the emission range within the emission angle of the LED chip 200. For example, the emission angle 200 is 120 degrees, and the top part 402 of the lens 400 covers the emission range within 120 degrees from the LED chip 200. In some embodiments, the reflective layer 500 covers part of the lens 400 and exposes the top part 402 of the lens 400. Because the top part 402 of the lens 400 is not covered by the reflective layer 500, the light emitted by the LED chip 200 within the emission angle can propagates out of the lens 400. As shown in FIG. 1, the light A orthogonally emitted by the top surface 202 of the LED chip 200 propagates through the wavelength conversion layer 300, and then propagates through the top part 402 of the lens 400 without being reflected. It is noted that "orthogonally emitted" refers that the path of the light A is perpendicular to the top surface 202 of the LED chip 200.

Except for the top part 402, the lens 400 includes a lateral surface 404. The lateral surface 404 of the lens 400 is located beyond the emission range within the emission angle of the LED chip 200. The reflective 500 covers at least part of the lateral surface 404, so as to reflect the light emitted by the lateral surface 204 of the LED chip 200 back to the space between the lens 400 and the LED chip 200.

Figure 2:
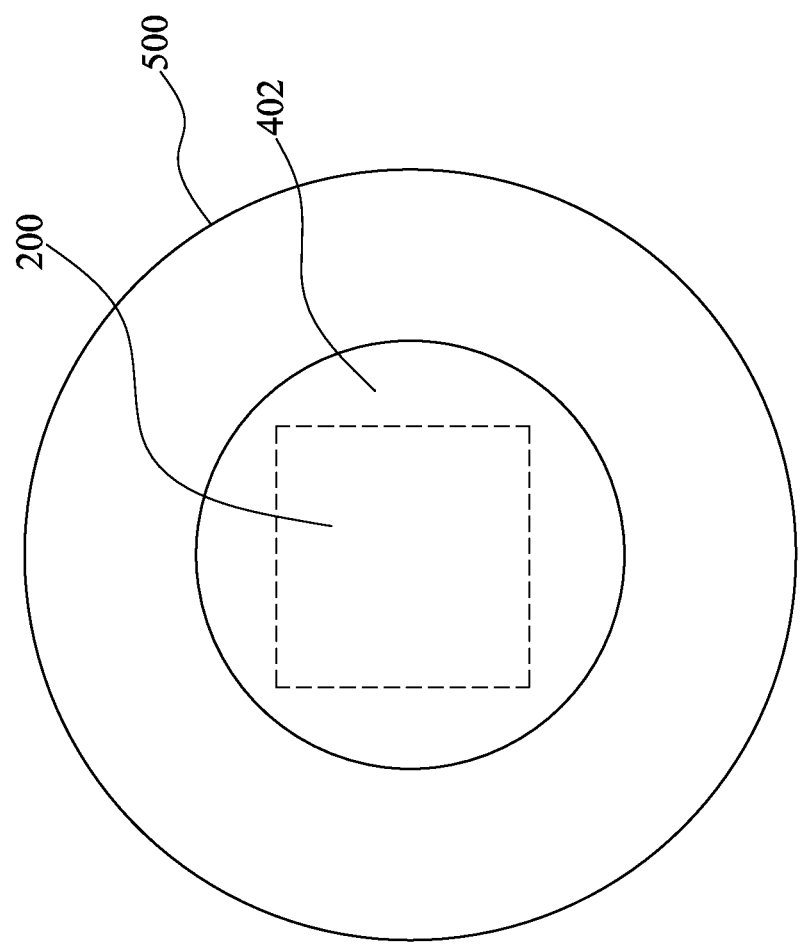
FIG. 2 is a top view of the LED in FIG. 1.

In some embodiments, the reflective layer 500 surrounds the lateral surface 404 of the lens 400. FIG. 2 is a top view of the LED in FIG. 1. As shown in FIG. 2, the reflective layer 500 is a ring-shaped structure. The reflective layer 500 surrounds the lateral surface 404 of the lens 400 (See FIG. 1), and exposes the top part 402 of the lens 400. Therefore, the reflective layer 500 further prevents the light emitted by the lateral surface 204 of the LED 200 from propagating out of the lens 400.

Referring FIG. 1, in some embodiments, the reflective layer 500 includes a top part 502 and a bottom part 504. The bottom part of the reflective layer 500 is disposed on the substrate 100. The top part 502 of the reflective layer 500 and a middle point 206 of a bottom surface of the LED chip 200 draws an imaginary line (See the dash line), and an angle θ is included between the imaginary line and the substrate 100. In some embodiments, the angle θ is greater than 0 degrees and less than 45 degrees. If the emission angle of the LED chip 200 is about 120 degrees, the angle θ is about 30 degrees, so as to prevent the reflective layer 500 from reflecting the light emitted by the top surface 202 of the LED chip 200.

In some embodiments, the thickness d1 of the reflective layer 500 decreases along a direction away from the substrate 100. Specifically, the thickness d1 of the bottom part 504 of the reflective layer 500 is greater than the thickness d1 of the top part 502. The thickness d1 gradually decreases from the bottom part 504 to the top part 502. In some embodiments, the difference between the thickness d1 of the bottom part 502 and the thickness d1 of the top part 504 is greater than 1 μm. In other words, the thickness d1 of the bottom part 504 is at least greater than the thickness d1 of the top part 502 and the difference therebetween is greater than 1 μm. The thickness d1 of the reflective layer 500 refers to the distance between the outer surface of the reflective layer 500 and the interface between the reflective layer 500 and the lens 400.

In some embodiments, a plurality of reflective micro particles 600 is doped in the reflective layer 500, so as to reflect the light emitted by the lateral surface 204 of the LED chip 200 to the space between the lens 400 and the LED chip 200. Specifically, when the light B emitted by the lateral surface 204 of the LED chip 200 propagates into the reflective layer 500 and meets the reflective micro particles 600, it is reflected by the reflective micro particles 600 and propagates back to the space between the lens 400 and the LED chip 200, thereby preventing halation. In some embodiments, the material of the reflective micro particle 600 is, but is not limited to be, zinc oxide ($ZnO_x$), titanium oxide ($TiO_x$) or aluminium oxide ($Al_xO_y$). In some embodiments, the lens 400 is formed by, but is not limited to be formed by, Silicone™ or epoxy. In some embodiments, the lens 400 is formed by, but is not limited to be formed by, the glass or Polycarbonate (PC), and material, such as Silicone™ or epoxy, can be filled in the space between the lens 400 and the LED chip 200.

In some embodiments, the LED includes a circuit layer 700. The circuit layer 700 is disposed on the substrate 100 for electrically connect to the LED chip 200. Further, the LED includes at least one wire 800. The wire 800 is electrically connected between the circuit layer 700 and the LED chip 200, so as to drive the LED chip 200 for emitting light.

In some embodiments, the LED chip 200 is an ultraviolet LED chip or a blue LED chip emitting a light in a range of a first wavelength. The wavelength conversion layer 300 includes a wavelength conversion material 900 for converting the first wavelength to a second wavelength. The second wavelength is greater than the first wavelength. Specifically, the LED chip 200 emits the light in the range of the first wavelength, such as the ultraviolet or blue light. The light in the range of the first wavelength stimulates the wavelength conversion material 900, so that after propagating through the wavelength conversion layer 300, the light in the range of the first wavelength can be converted to the light in the range of the second wavelength, such as the red or green light.

For example, when the LED chip 200 emits the ultraviolet light, the wavelength conversion material 900 can be red color conversion material, a blue color conversion material, a green color conversion material or any combinations thereof, so that the ultraviolet light can be converted to the visible light in various color. In some embodiments, the wavelength conversion material 900 can be, but is not limited to be, a phosphor, a dye, a pigment or any combinations thereof.

Figure 3:
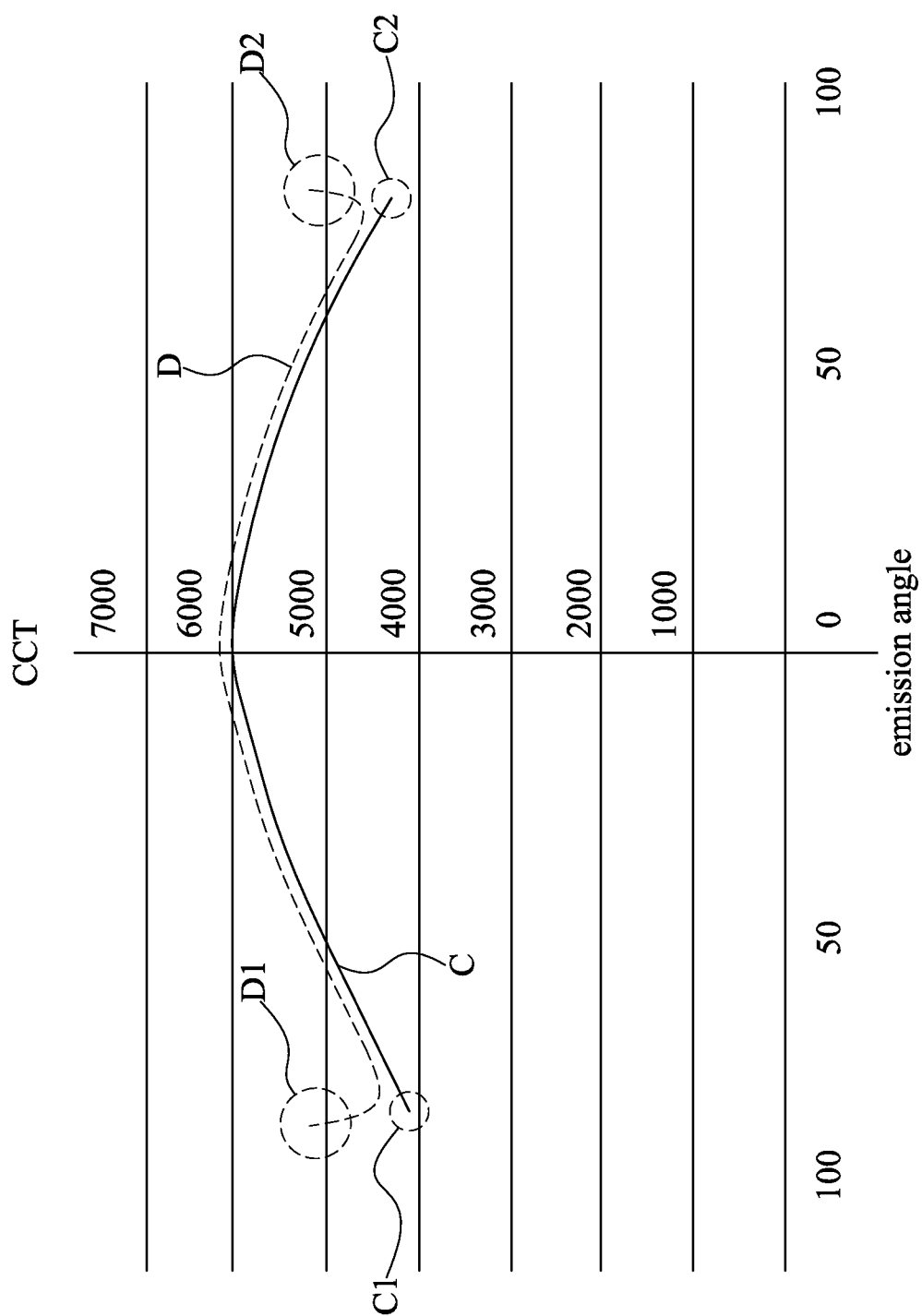
FIG. 3 is a correlated color temperature (CCT) diagram illustrating the CCT of the LED in FIG. 1 and a typical LED.

FIG. 3 is a correlated color temperature (CCT) diagram illustrating the CCT of the LED in FIG. 1 and a typical LED. In this diagram, the ordinate axis refers to the CCT value, and the abscissa axis refers to the emission angle of the LED. Curve C refers to the CCT of the LED in FIG. 1, and the curve D refers to the CCT of the typical LED. As shown in FIG. 3, the height of curve C is gradually reduced outwardly. In other words, the CCT of the LED in FIG. 1 decreases as the emission angle increases, and therefore, the CCT at the boundary areas C1 and C2 decreases. However, because the typical LED does not include the reflective layer 500 provided by the present invention, the CCT at the boundary areas D1 and D2 of the curve D increases immediately, causing the halation. In other words, because in embodiments of the present invention, the reflective layer 500 reflects the lateral surface 204 of the LED chip 200 to the space between the LED chip 200 and the lens 400, no pattern of the halation in the range of the short wavelength, such as the blue light, is seen around the lens 400. In other words, the CCT at the boundary areas C1 and C2 does not increase, thereby eliminating the halation.

Figure 4:
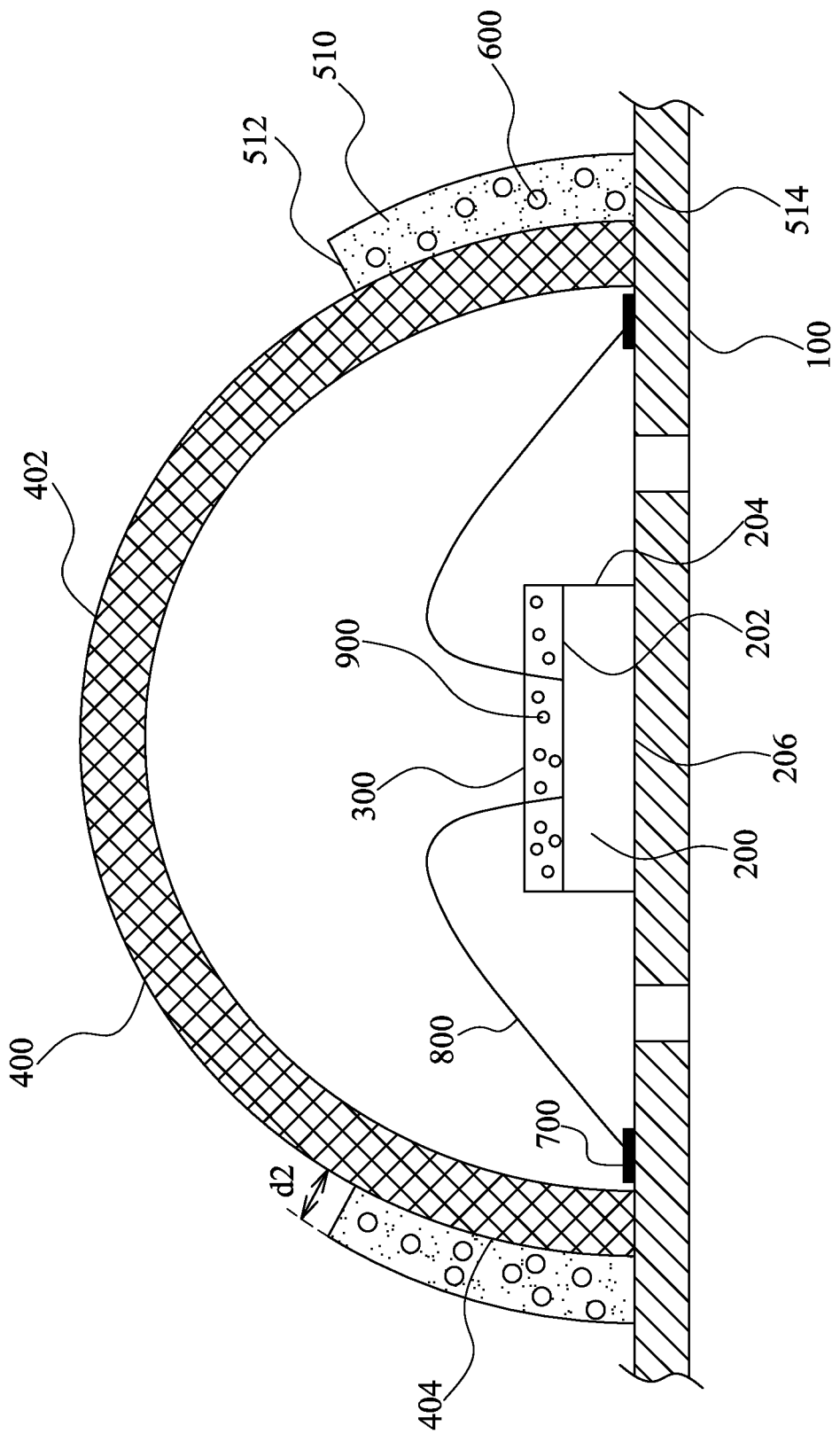
FIG. 4 is a cross-sectional view of the LED in accordance with another embodiment of the present invention.

FIG. 4 is a cross-sectional view of the LED in accordance with another embodiment of the present invention. The main difference between this embodiment and FIG. 1 is that the thickness d2 of the reflective layer 510 in this embodiment is constant. In other words, the thickness d2 of the top part 510 and the thickness d2 of the bottom part 514 of the reflective layer 510 are equal, and the thickness d2 of any position between the top part 510 and the bottom part 514 is constant. The thickness d2 of the reflective layer 510 refers to the distance between the outer surface of the reflective layer 510 and the interface between the reflective layer 510 and the lens 400. In this embodiment, the thickness of the lens 400 is constant.

It is noted that the description "the feature A is disposed on the feature B" in this specification not only refers to the embodiment that the feature A directly contacts the feature B, but also refers to the embodiment that an additional feature C is disposed between the feature A and the feature B. For example, the description "the LED chip 200 is disposed on the substrate 100" not only refers that the LED chip 200 directly contacts the substrate 100, but also refers that an additional element, such as a heat dissipation layer, is included between the LED chip 200 and the substrate 100.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A Light emitting diode (LED), comprising:
a substrate;
an LED chip mounted on the substrate;
a wavelength conversion layer covering a top surface of the LED chip and exposing a lateral surface of the LED chip;
a lens disposed on the substrate and enclosing the LED chip and the wavelength conversion layer; and
a reflective layer disposed on the lens for reflecting a light emitted from the lateral surface of the LED chip.

2. The LED of claim 1, wherein the reflective layer covers part of the lens and exposes a top part of the lens.

3. The LED of claim 2, wherein the reflective layer surrounds a lateral surface of the lens.

4. The LED of claim 3, wherein a bottom part of the reflective layer is disposed on the substrate, and a top part of the reflective layer and a middle point of a bottom surface of the LED chip draws an imaginary line in which an angle is included between the imaginary line and the substrate.

5. The LED of claim 4, wherein the angle is greater than 0 degrees and less than 45 degrees.

6. The LED of claim 5, wherein a thickness of the reflective layer decreases along a direction away from the substrate.

7. The LED of claim 6, wherein a thickness difference between the bottom part of the reflective layer and the top part of the reflective layer is greater than 1 μm.

8. The LED of claim 1, wherein a thickness of the reflective layer is constant.

9. The LED of claim 1, wherein a thickness of the lens is constant.

10. The LED of claim 1, further comprising a plurality of reflective micro particles doped in the reflective layer, wherein the material of the reflective micro particles is zinc oxide, titanium oxide or aluminium oxide.

11. The LED of claim 1, further comprising a circuit layer disposed on the substrate.

12. The LED of claim 11, further comprising at least one wire electrically connected between the circuit layer and the LED chip.

13. The LED of claim 1, wherein the LED chip is an ultraviolet LED chip or a blue LED chip emitting a light in a range of a first wavelength.

14. The LED of claim 13, wherein the wavelength conversion layer comprises a wavelength conversion material for converting the first wavelength to a second wavelength, wherein the second wavelength is greater than the first wavelength.

15. The LED of claim 14, wherein the wavelength conversion material is a red color conversion material, a blue color conversion material, a green color conversion material or any combinations thereof.

16. The LED of claim 15, wherein the wavelength conversion material is a phosphor, a dye, a pigment or any combinations thereof.

* * * * *